United States Patent
Lin (10) Patent No.: US 7,609,108 B2
(45) Date of Patent: Oct. 27, 2009

(54) PHASE-LOCKED LOOP AND COMPOUND MOS CAPACITOR THEREOF

(75) Inventor: Hsiao-Chyi Lin, Taipei County (TW)

(73) Assignee: Via Technologies, Inc., Taipei (TW)

( * ) Notice: Subject to any disclaimer, the term of this patent is extended or adjusted under 35 U.S.C. 154(b) by 99 days.

(21) Appl. No.: 11/834,067

(22) Filed: Aug. 6, 2007

(65) Prior Publication Data

US 2008/0224745 A1 Sep. 18, 2008

(30) Foreign Application Priority Data

Mar. 12, 2007 (TW) .............................. 96108401 A (51) Int. Cl.
*H04B 1/10* (2006.01)
*H03K 5/00* (2006.01)

(52) U.S. Cl. ................... 327/551; 327/558; 327/263; 327/264; 331/17

(58) Field of Classification Search .................. None
See application file for complete search history.

(56) References Cited

U.S. PATENT DOCUMENTS

| | | | | |
|---|---|---|---|---|
| 4,453,090 A | * | 6/1984 | Sempel | 327/566 |
| 4,617,529 A | * | 10/1986 | Suzuki | 331/57 |
| 5,130,564 A | * | 7/1992 | Sin | 327/264 |
| 5,180,938 A | * | 1/1993 | Sin | 327/288 |
| 5,479,132 A | * | 12/1995 | Verhaeghe et al. | 327/553 |
| 5,959,502 A | * | 9/1999 | Ovens et al. | 331/8 |
| 6,633,189 B1 | * | 10/2003 | Gradinariu et al. | 327/262 |
| 6,828,654 B2 | * | 12/2004 | Tam et al. | 257/532 |
| 6,867,629 B2 | * | 3/2005 | Drost et al. | 327/270 |
| 2002/0149429 A1 | * | 10/2002 | Sander | 331/17 |
| 2004/0232999 A1 | * | 11/2004 | Kim | 331/17 |

* cited by examiner

*Primary Examiner*—Tuan Lam
(74) *Attorney, Agent, or Firm*—Thomas, Kayden, Horstemeyer & Risley (57) ABSTRACT

Compound MOS capacitors and phase-locked loop with the compound MOS capacitors are disclosed. In the phase-locked loop, the compound MOS capacitors of the loop filter are HV (high voltage) devices, and the voltage control oscillator is a LV (low voltage) device. The compound MOS capacitor comprises a HV PMOS capacitor having a base coupled to a source terminal of a low voltage source and a HV NMOS capacitor having a base coupled to a ground terminal of the low voltage source. The gates of the HV PMOS capacitor and the HV NMOS capacitor are connected together to receive a control voltage. The capacitance of the compound MOS capacitor is near constant in any control voltage.

10 Claims, 8 Drawing Sheets

PHASE-LOCKED LOOP AND COMPOUND MOS CAPACITOR THEREOF

BACKGROUND OF THE INVENTION

1. Field of the Invention

The invention relates to MOS capacitors, and particularly to compound MOS capacitors and phase-locked loops using these compound MOS capacitors.

2. Description of the Related Art

In the field of wireless radio frequency communication, the speed of transceivers and receivers is dependent on the speed of the clock. To generate a high-speed clock, the speed of the phased-locked loop has to be improved. One way to improve the speed of the phase-locked loop is utilizing advanced IC manufacturing process, such as processes lower than 0.15 μm. However, the advanced manufacturing process usually has thin oxide at the gate which results in serious current leakage. The current leakage damages the function of MOS capacitors a lot. For example, the current leakage results in asymmetric charging/discharging periods of the MOS capacitor. To deal with the current leakage, the MOS capacitors of phase-locked loop are designed to have thick oxide at the gates. Devices having thin gate oxide are named Low-Voltage devices (LV devices) since they are usually supplied by low voltage sources. Devices having thick gate oxide are named High-Voltage devices (HV devices) since they are usually supplied by high voltage sources.

Figure 1:
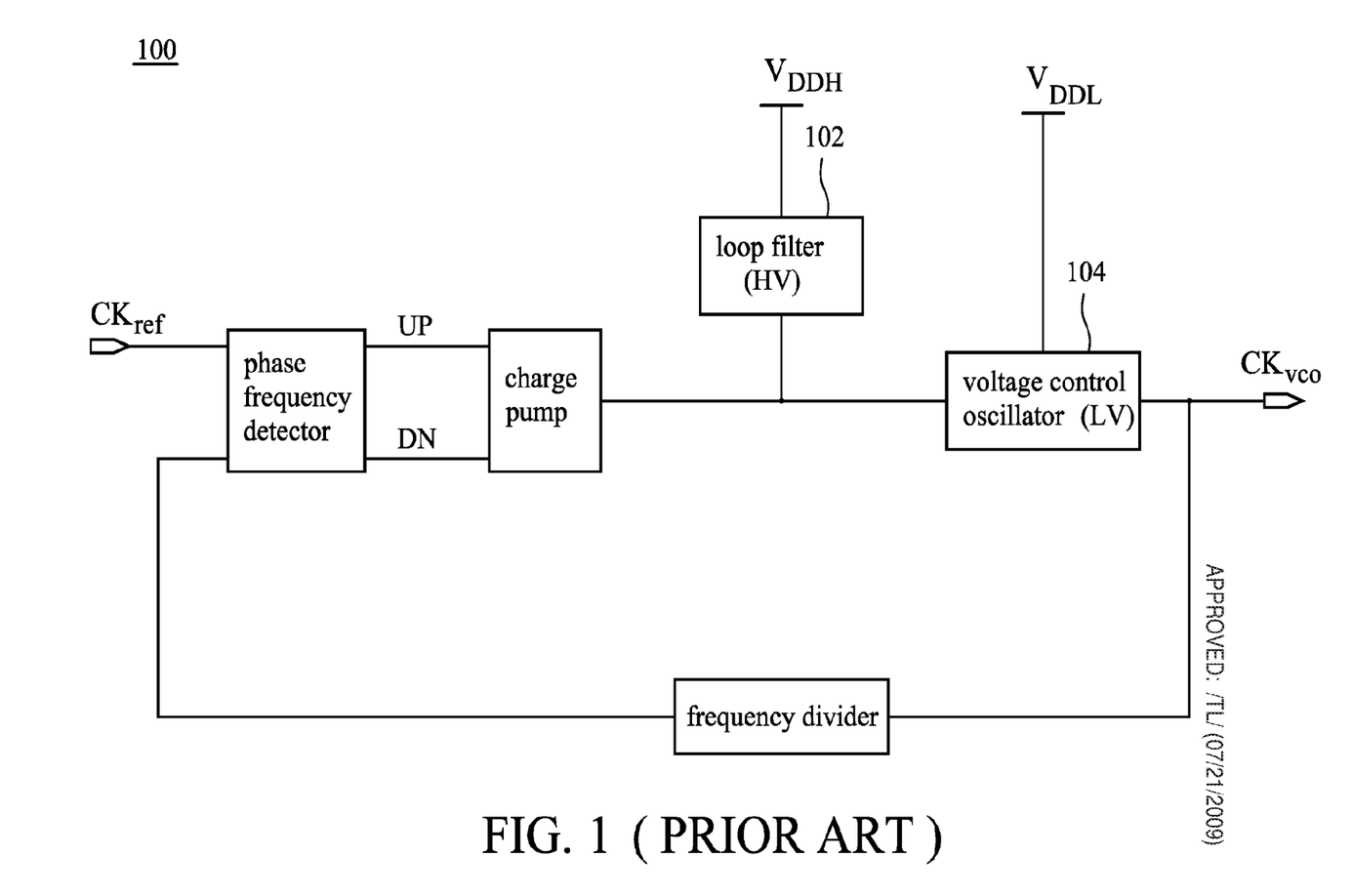
FIG. 1 shows a conventional phase-locked loop.

FIG. 1 shows one of the conventional phase-locked loops. To ensure the phase-locked loop 100 works at high frequencies, the voltage control oscillator 104 is implemented as a LV device to generate a high frequency clock. To prevent current leakage in the MOS capacitors of the loop filter 102, the loop filter 102 is implemented as a HV device. As shown in FIG. 1, the phase-locked loop 100 requires at least two voltage sources, one high voltage source outputting $V_{DDH}$ for the HV device (the loop filter 102), and one low voltage source outputting $V_{DDL}$ for the LV device (the voltage control oscillator 104).

The capacitors of the loop filter 102 are conventional HV MOS capacitors, such as a HV PMOS capacitor or a HV NMOS capacitor. The conventional HV MOS capacitor is near a constant capacitance only when the voltage level of the gate of the HV MOS capacitor is controlled within a specific range. To ensure the capacitance of a HV NMOS capacitor is near a constant value, the voltage level of the gate of the HV NMOS capacitor has to be greater than $V_{thn\_HV}$, the threshold voltage of the HV NMOS capacitor. To ensure the capacitance of a HV PMOS capacitor is near a constant value, the voltage level of the gate of the HV PMOS capacitor has to be lower than $(V_{DD}-|V_{thp\_HV}|)$, where $V_{DD}$ is the voltage value of the base of the HV PMOS capacitor and $V_{thp\_HV}$ is the threshold voltage of the HV PMOS capacitor. In the case shown in FIG. 1, the normal operation range of the gates of the conventional HV MOS capacitors of the loop filter 102 is affected by the low voltage source $V_{DDL}$ that powers the voltage control oscillator 104. In a case that $V_{DDL}=1.2V$, $V_{DDH}=2.5V$, $V_{thn\_HV}=|V_{thp\_HV}|=0.8V$, and the capacitor of the loop filter 102 is a HV NMOS capacitor, the voltage level of the gate of the HV NMOS capacitor has to be limited in a very narrow voltage range, greater than $0.8V(V_{thn\_HV})$ and lower than $1.2V(V_{DDL})$, to maintain at a constant capacitance. Obviously, a HV NMOS capacitor is not a good proposal to implement the capacitor in the loop filter 102. In another case that the capacitor of the loop filter 102 is a HV PMOS capacitor, the voltage level of the gate of the HV PMOS capacitor has to be lower than $1.2V(V_{DDL})$, that lower than $1.7V(V_{DDH}-|V_{thp\_HV}|)$, to maintain at a constant capacitance. Although the operation range of the gate of the HV PMOS capacitor (0V~1.2V) is much larger than the operation range of the gate of the HV NMOS capacitor (0.8V~1.2V), there are still some drawbacks when applying the HV PMOS capacitors in the loop filter 102. One of the drawbacks is the jitter performance of the voltage control oscillator 104. The jitter performance occurs by disturbance on the signal transmitted from the HV device (loop filter 102) to the LV device (voltage control oscillator 104). The disturbance is perturbed by the voltage source of the loop filter 102 ($V_{DDH}$). In the conventional phase-locked loop 100, because the voltage source of the loop filter 102 ($V_{DDH}$) is different from that of the voltage control oscillator 104 ($V_{DDL}$), the signal disturbance is worse than that having the same voltage sources, and so that the jitter performance is worse than that having the same voltage sources.

Desirable MOS capacitors should solve current leakage, reduce the number of voltage sources required in a phase-locked loop, expand normal operation range of the voltage level of the gate of the MOS capacitor, and improve jitter performance.

BRIEF SUMMARY OF THE INVENTION

The invention provides compound MOS capacitors and phase-locked loops comprising the compound MOS capacitors.

The phase-locked loop of the invention comprises a phase frequency detector detecting phase difference and frequency difference between a reference signal and a feedback signal, a charge pump comprising a charge circuit and a discharge circuit, a loop filter comprising at least one compound MOS capacitor, and a voltage control oscillator generating an oscillating signal. Based on the phase difference and frequency difference between the reference signal and the feedback signal, the charge pump switches between the charge circuit and the discharge circuit to charge/discharge the compound MOS capacitor to adjust the voltage level of the output terminal of the loop filter. According to the voltage level of the output terminal of the loop filter, the voltage control oscillator adjusts the frequency of the oscillating signal.

Some devices of the phase-locked loop are HV devices, and some other devices of the phase-locked loop are LV devices, wherein the gate oxide thickness of the HV device is greater than the gate oxide thickness of the LV device. In the invention, the compound MOS capacitor of the loop filter is a HV device, and the voltage control oscillator is a LV device. The compound MOS capacitor and the voltage control oscillator are both powered by a low bias voltage source (outputting a voltage level of $V_{DDL}$).

The compound MOS capacitor comprises a HV PMOS capacitor and a HV NMOS capacitor. The HV PMOS capacitor has a base coupled to source terminal of the low bias voltage source. The HV NMOS capacitor has a base coupled to ground terminal of the low bias voltage source. The gates of the HV PMOS capacitor and the HV NMOS capacitor are connected together to receive a control signal. The capacitance of the compound MOS capacitor is near constant and at any control voltage.

In some embodiments, the value of the threshold voltage of the HV PMOS capacitor is $|V_{thp\_HV}|$, and the threshold voltage of the HV NMOS capacitor, $V_{thn\_HV}$, approximates $(V_{DDL}-|V_{thp\_HV}|)$, where the $V_{DDL}$ is the voltage level of the source terminal of the low bias voltage source. In other embodiments, the HV PMOS capacitor and the HV NMOS capacitor have the same channel length.

In some embodiments, the loop filter further comprises a resistor, a first compound MOS capacitor, and a second compound MOS capacitor. The first terminal of the resistor couples to the output terminal of the loop filter. The control terminal of the first compound MOS capacitor is coupled to the second terminal of the resistor. The control terminal of the second compound MOS capacitor is coupled to the output terminal of the loop filter.

The above and other advantages will become more apparent with reference to the following description taken in conjunction with the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 2:
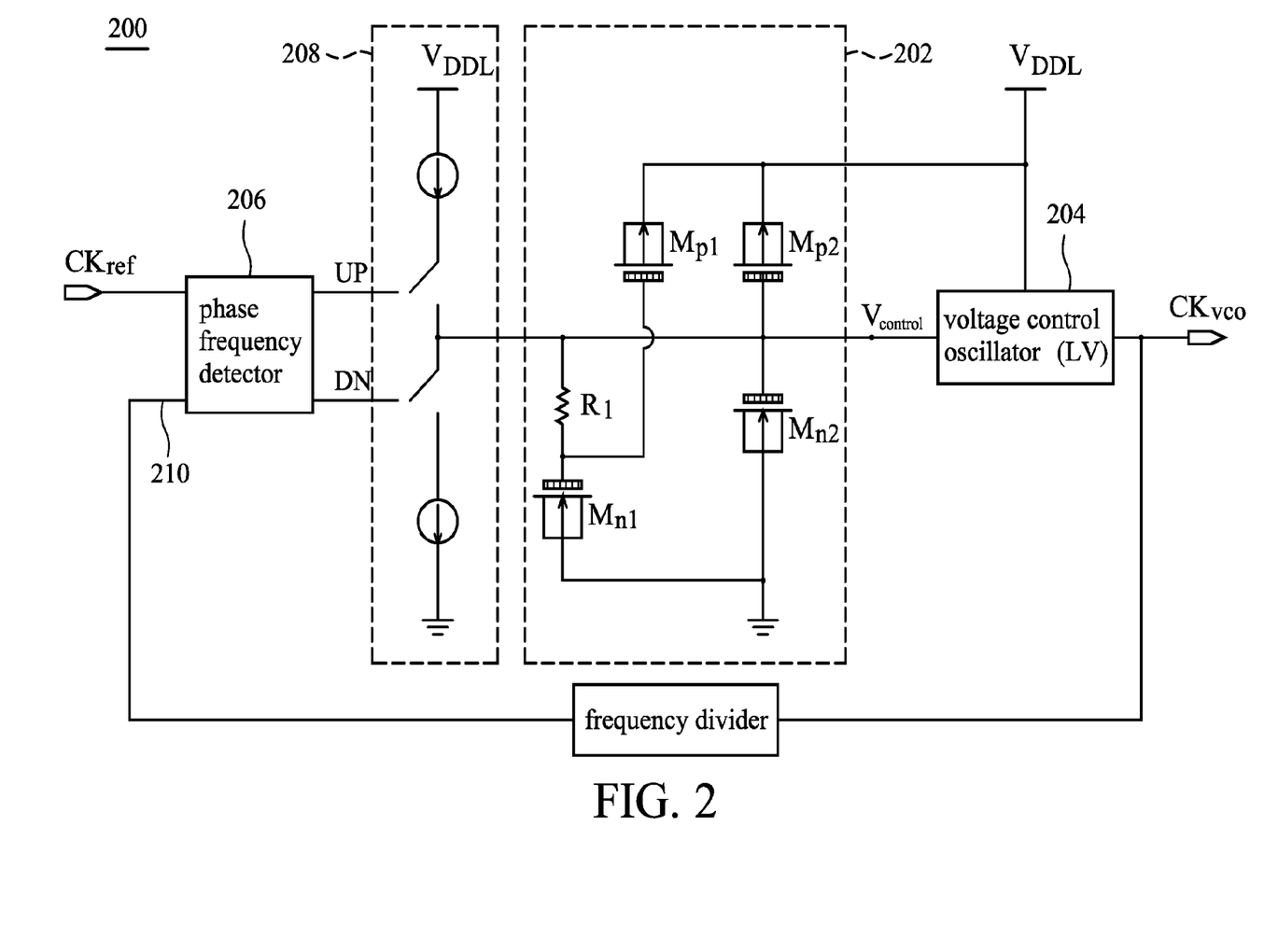
FIG. 2 shows a phase-locked loop of the invention.

FIG. 2 shows an embodiment of the phase-locked loop of the invention. The phase-locked loop 200 comprises a phase frequency detector 206, a charge pump 208, a loop filter 202, and a voltage control oscillator 204. The loop filter 202 comprises a resistor $R_1$, a first compound MOS capacitor comprising a HV NMOS capacitor $M_{n1}$ and a HV PMOS capacitor $M_{p1}$, and a second compound MOS capacitor comprising a HV NMOS capacitor $M_{n2}$ and a HV PMOS capacitor $M_{p2}$. The output terminal ($V_{control}$) of the loop filter 202 couples to the first terminal of the resistor $R_1$. The control terminal of the first compound MOS capacitor is coupled to the second terminal of the resistor $R_1$. The control terminal of the second compound MOS capacitor couples to the output terminal ($V_{control}$) of the loop filter 202.

The phase frequency detector 206 detects phrase difference and frequency difference between a reference signal $CK_{ref}$ and a feedback signal 210. The charge pump 208 comprises a charge circuit and a discharge circuit. According to the phase difference and frequency difference between the reference signal $CK_{ref}$ and the feedback signal 210, the charge pump 208 switches between the charge circuit and the discharge circuit to control the voltage level of the output terminal of the loop filter 202 ($V_{control}$). The voltage control oscillator 204 generates an oscillating signal $CK_{vco}$ and adjusts the frequency of the oscillating signal $CK_{vco}$ according to $V_{control}$.

Figure 3:
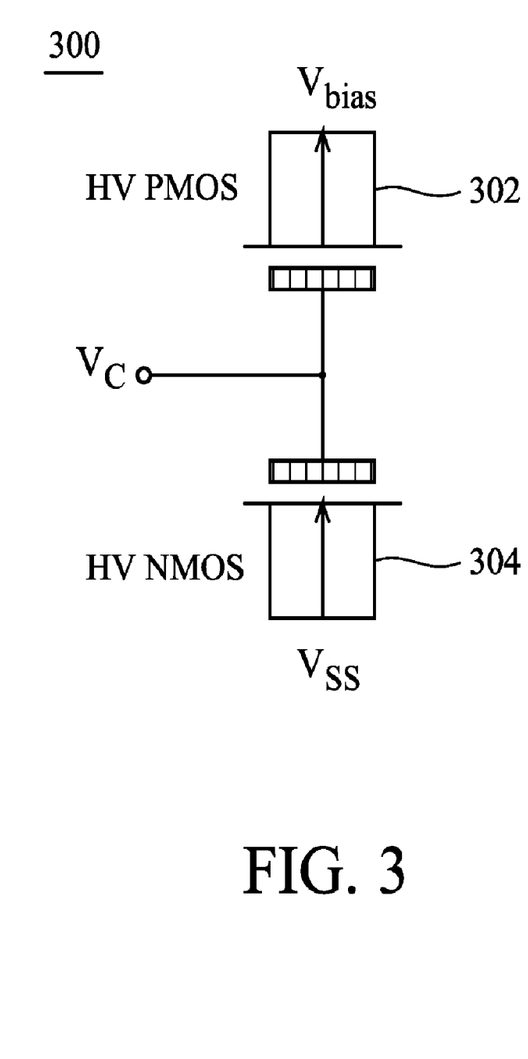
FIG. 3 shows a compound MOS capacitor of the invention.

FIG. 3 shows a compound MOS capacitor of the invention. The compound MOS capacitor 300 comprises a HV PMOS capacitor 302 and a HV NMOS capacitor 304. The base, drain, and source of the HV PMOS capacitor 302 are all coupled to a low bias voltage $V_{bias}$. In some embodiments, $V_{bias}$ is the output voltage of a low voltage source supplying the system. The base, drain, and source of the HV NMOS capacitor 304 are all coupled to the ground terminal of the low voltage source ($V_{SS}$). The gates of the HV PMOS capacitor 302 and the HV NMOS capacitor 304 are connected together to receive a control voltage $V_c$. In some cases, the threshold voltage of the HV NMOS capacitor 304, $V_{thn\_HV}$, approximates $V_{bias}-|V_{thp\_HV}|$ (or $V_{DDL}-|V_{thp\_HV}|$ when $V_{bias}=V_{DDL}$), where $V_{thp\_HV}$ is the threshold voltage of the HV PMOS capacitor 302. In such cases, the capacitance of the compound MOS capacitor 300 varies within ±10% at any control voltage $V_c$, which is within the allowable range. The compound MOS capacitor 300 can be treated as a constant-capacitance capacitor.

Figure 4A:
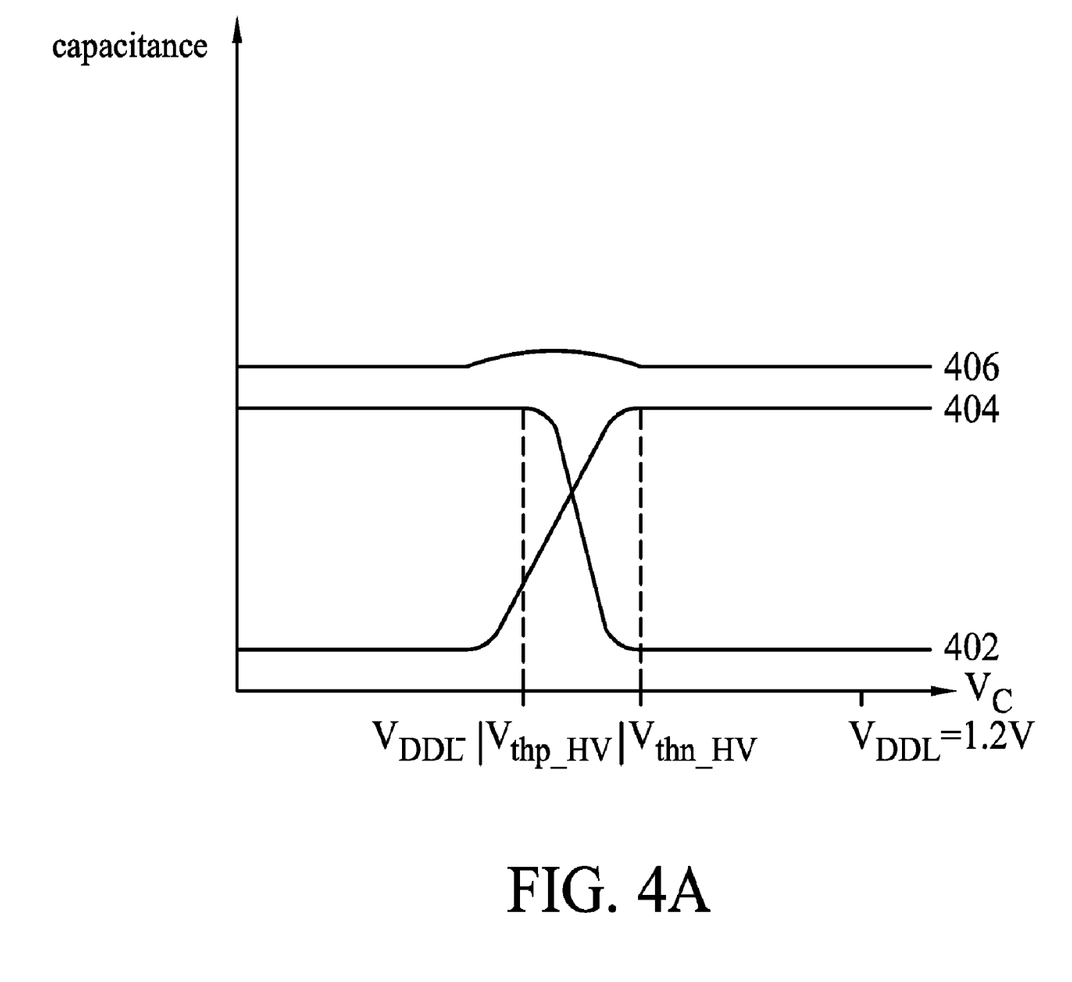
FIG. 4A shows the relationship between the control voltage $V_c$ and the capacitance of the MOS capacitors, wherein $V_{DDL}$=1.2V.
Figure 4B:
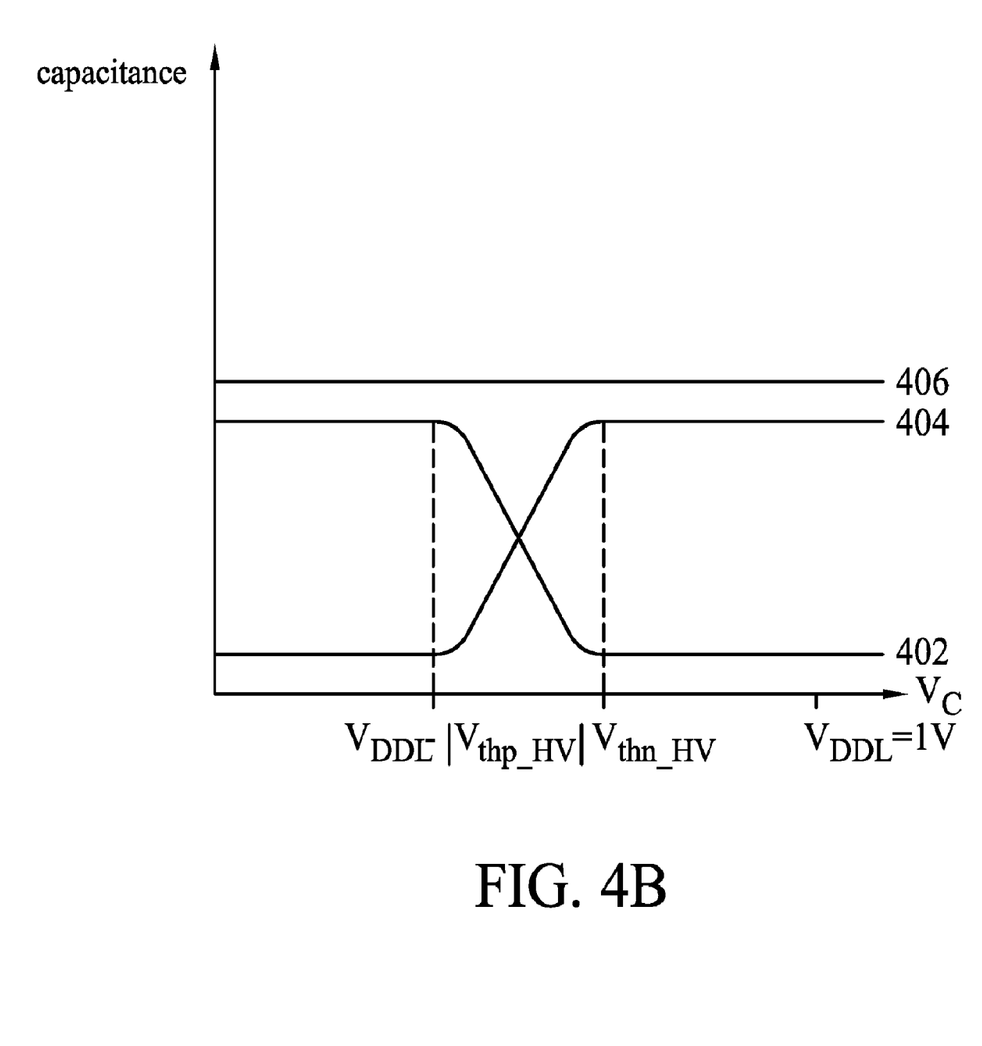
FIG. 4B shows the relationship between the control voltage $V_c$ and the capacitance of the MOS capacitors, wherein $V_{DDL}$=1V.
Figure 4C:
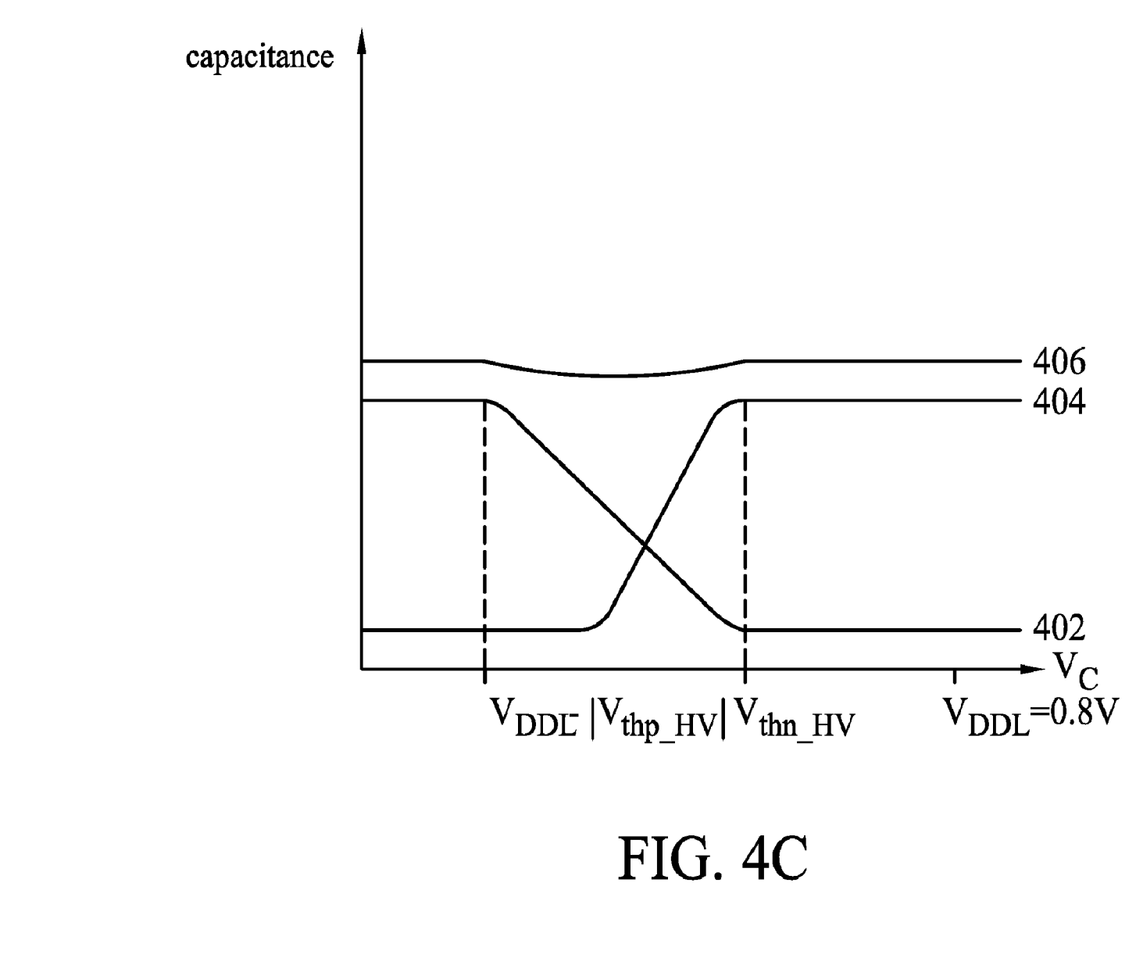
FIG. 4C shows the relationship between the control voltage $V_c$ and the capacitance of the MOS capacitors, wherein $V_{DDL}$=0.8V.

FIGS. 4A, 4B, and 4C show the relationship between the control voltage $V_c$ and the capacitances of the MOS capacitors. In these embodiments, the manufacturing process is Fujitsu 0.09 μm, and the bias voltage of the HV PMOS capacitor 302 is provided by a low voltage source $V_{DDL}$. In FIGS. 4A, 4B and 4C, $V_{DDL}$ are 1.2V, 1V and 0.8V, respectively. Curves 402, 404, and 406 show capacitances of the HV PMOS capacitor 302, HV NMOS capacitor 304, and the compound MOS capacitor 300, respectively. The threshold voltages of the HV PMOS capacitor 302 and the HV NMOS capacitor 304 are $V_{thp\_HV}$ and $V_{thn\_HV}$, respectively. As shown in FIG. 4A, the capacitance of the compound MOS capacitor 300 is the summation of the capacitances of the HV PMOS capacitor 302 and the HV NMOS capacitor 304. $V_{thn\_HV}$ has to approximate $V_{DDL}-|V_{thp\_HV}|$ to ensure the capacitance of the compound MOS capacitor 300 maintains a near constant value. In the cases shown in FIGS. 4A, 4B and 4C, $V_{thn\_HV}$ equals $|V_{thp\_HV}|$ and is within the range between 0.6V to 0.8V. The variation of the compound MOS capacitor 300 is within ±10%, which is within the tolerance of capacitance variation. The compound MOS capacitor 300 can be treated as a constant-capacitance capacitor. In some embodiments, in addition to adjusting the bias voltage $V_{DDL}$, the compound MOS capacitor 300 can be made to have constant capacitance by adjusting the value of $V_{thn\_HV}$ and $|V_{thp\_HV}|$. One way to adjust $V_{thn\_HV}$ and $|V_{thp\_HV}|$ is ion implantation, wherein $V_{thn\_HV}$ has to approximate to $V_{bias}-|V_{thp\_HV}|$.

In some embodiments, the HV PMOS capacitor 302 and the HV NMOS capacitor 304 have the same channel lengths ($L_p=L_n$) but different channel widths ($W_p=K \cdot W_n$), where the channel lengths of the HV PMOS capacitor 302 and HV NMOS capacitor 304 are $L_p$ and $L_n$, respectively, the channel widths of the HV PMOS capacitor 302 and HV NMOS capacitor 304 are $W_p$ and $W_n$, respectively, and K represents a P/N ratio between the HV PMOS capacitor 302 and HV NMOS capacitor 304. In such cases, the capacitance of the compound MOS capacitor 300 is $K \cdot W_n \cdot L_p \cdot C_{oxp}(V_c) + W_n \cdot L_n \cdot C_{oxn}(V_c)$, where $C_{oxp}(V_c)$ and $C_{oxn}(V_c)$ are unit capacitance of the HV PMOS capacitor 302 and HV NMOS capacitor 304, respectively. In some embodiments of manufacturing the compound MOS capacitor 300, the manufacturing process of the HV NMOS capacitor 304 is fixed, and the manufacturing process of the HV PMOS capacitor 302 is continually refined until the capacitance of the compound MOS capacitor 300 approximates a constant value. In other embodiments, the manufacturing process of the HV PMOS capacitor 302 is fixed, and the manufacturing process of the HV NMOS capacitor 304 is continually refined until the capacitance of the compound MOS capacitor 300 approximates a constant value.

Figure 5A:
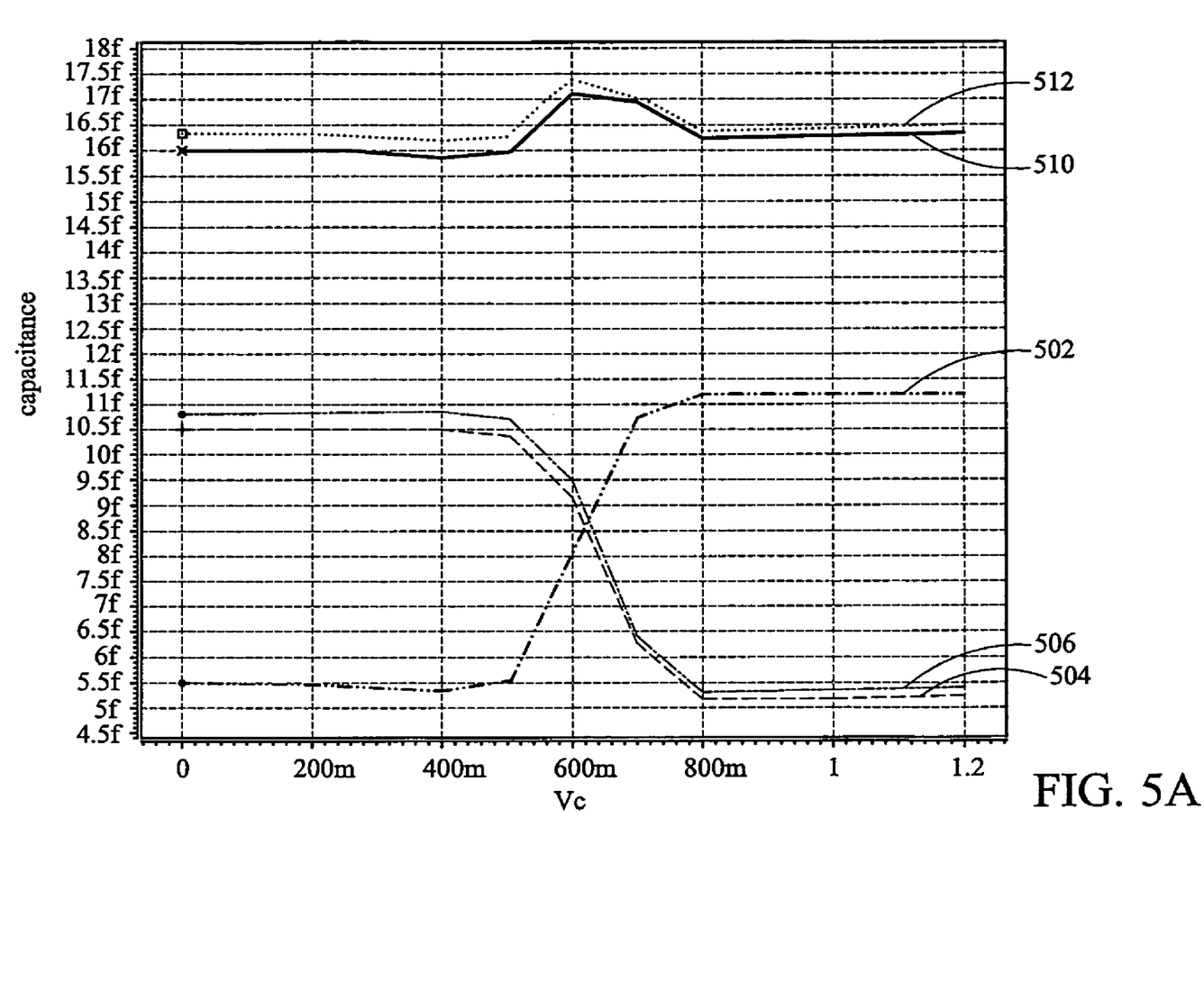
FIGS. 5A and 5B show the capacitance of the compound MOS capacitor 300 in different P/N ratios.
Figure 5B:
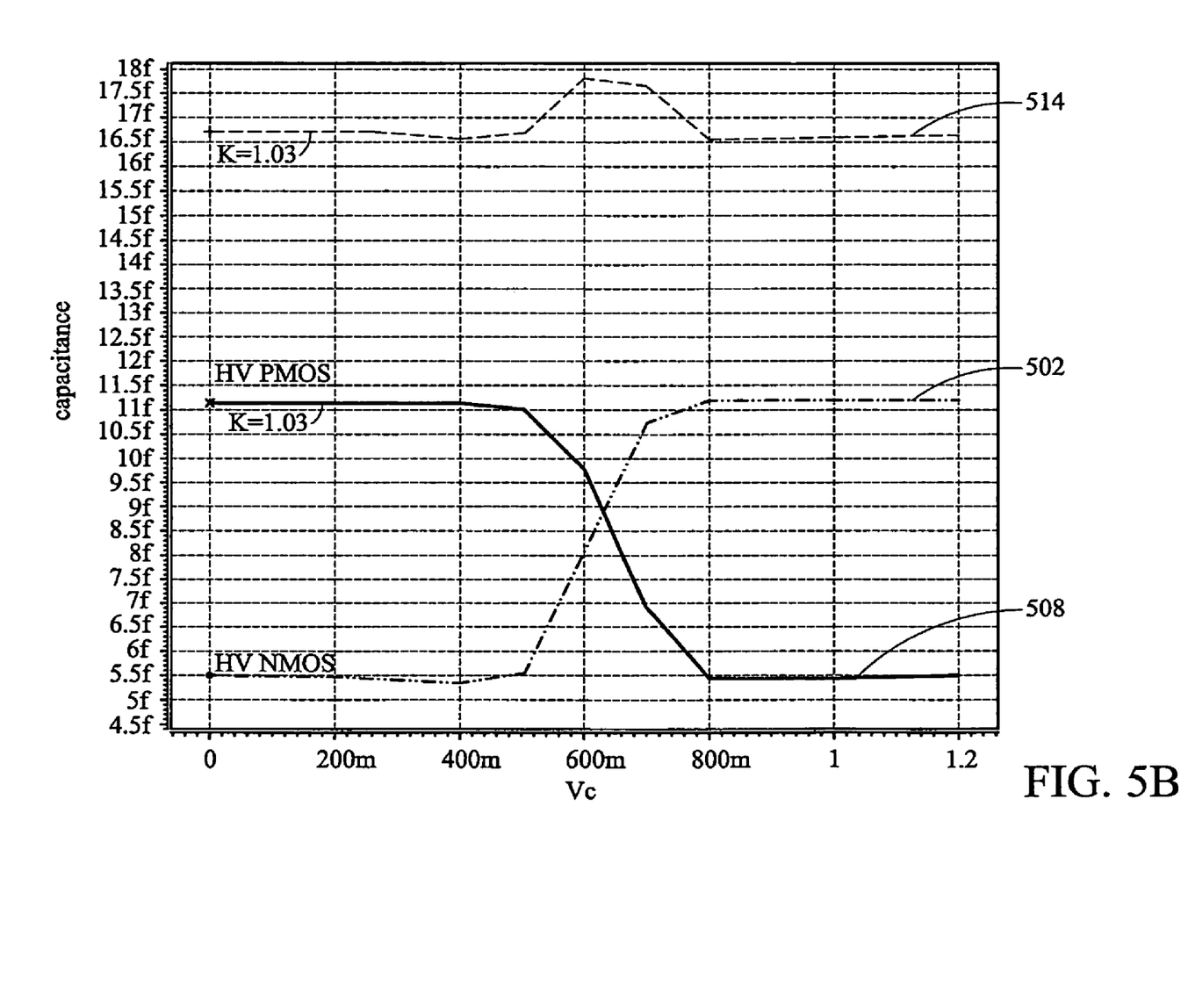

In some embodiment, the manufacturing processes of the HV PMOS capacitor 302 and HV NMOS capacitor 304 are both fixed and $L_p$ is set equal to $L_n$ to ensure frequency response coherence between the HV PMOS capacitor 302 and the HV NMOS capacitor 304, and the only adjustable factor of the capacitance of the compound MOS capacitor 300 is the P/N ratio K. FIGS. 5A and 5B show the capacitance of the compound MOS capacitor 300 in different P/N ratios, wherein the manufacturing process is Fujitsu 0.09 μm. Curve 502 shows the relationship between the capacitance of the HV NMOS capacitor 304 and the control voltage $V_c$, wherein the capacitance of the HV NMOS capacitor 304 is $W_n \cdot L_n \cdot C_{oxn}(V_c)$ The capacitance of the HV PMOS capacitor 302 is $K \cdot W_n \cdot L_p \cdot C_{oxp}(V_c)$. Curve 504 shows the relationship between the capacitance of the HV PMOS capacitor 302 and the control voltage $V_c$, wherein the P/N ratio K is 0.97. Curve 506 shows the relationship between the capacitance of the HV PMOS capacitor 302 and the control voltage $V_c$, wherein the P/N ratio K is 1. Curve 508 shows the relationship between the capacitance of the HV PMOS capacitor 302 and the control voltage $V_c$, wherein the P/N ratio K is 1.03. Corresponding to curves 504, 506 and 508, the curves showing the capacitance of the compound MOS capacitor 300 are 510, 512 and 514, respectively. By adjusting the P/N ratio K, a suitable design of the compound MOS capacitor is available.

The devices shown in FIG. 2 can be categorized as HV devices or LV devices. The gate oxide thickness of a HV device is greater than the gate oxide thickness of a LV device. The compound MOS capacitors in the loop filter 202 are HV devices. The voltage control oscillator 204 is a LV device. In some cases, the charge pump 208 is a HV device.

In the embodiment shown in FIG. 2, the voltage source power the phase-locked loop 200 is a low voltage source (outputting $V_{DDL}$). The compound MOS capacitor of the loop filter 202 and the voltage control oscillator 204 are all powered by the low voltage source. In such a design, the normal operation range of the compound MOS capacitor is expanded, and the jitter performance of the voltage control oscillator 204 is reduced. Compared to the conventional phase-locked loop 100 shown in FIG. 1, the phase-locked loop 200 of FIG. 2 only requires one voltage source $V_{DDL}$. The signal disturbance between the HV devices and LV devices are reduced, so that the jitter performance caused by the signal disturbance is reduced. The phase-locked loop 200 utilizing the compound MOS capacitors can provide a high frequency oscillating signal with low current leakage in the loop filter 202, and can expand the operation range of the control signal of the voltage control oscillator 204 with better jitter performance. In many manufacturing processes, a constant-capacitance compound MOS capacitor is available by just adjusting the P/N ratio K. Compared to conventional techniques, no further additional process or cost is required in the invention.

The compound MOS capacitor of the invention is not limited to be applied in phase-locked loops. The compound MOS capacitors can be applied in any devices requiring capacitors with wide normal operational range. Any techniques utilizing the compound MOS capacitor are in the scope of the invention.

While the invention has been described by way of example and in terms of best embodiment, it is to be understood that the invention is not limited thereto. To the contrary, it is intended to cover various modifications and similar arrangements (as would be apparent to those skilled in the art). Therefore, the scope of the appended claims should be accorded to the broadest interpretation so as to encompass all such modifications and similar arrangements.

What is claimed is:

1. A compound MOS capacitor, comprising:
 a HV PMOS capacitor with a HV PMOS threshold voltage, having a base coupling to a source terminal of a low bias voltage source; and
 a HV NMOS capacitor with a HV NMOS threshold voltage, having a base coupling to a ground terminal of the low bias voltage source,
 wherein a gate of the HV PMOS capacitor is connected with a gate of the HV NMOS capacitor to receive a control voltage,
 wherein a voltage difference between a voltage value of the source terminal of the low bias voltage source and an absolute value of the HV PMOS threshold voltage approximates to the HV NMOS threshold voltage.

2. The compound MOS capacitor as claimed in claim 1, wherein the HV PMOS capacitor and the HV NMOS capacitor have the same channel length.

3. The compound MOS capacitor as claimed in claim 1, wherein channel widths of the HV PMOS capacitor and the HV NMOS capacitor follow a P/N ratio.

4. The compound MOS capacitor as claimed in claim 1, wherein the compound MOS capacitor is applied in a chip powered by the low bias voltage source and having at least one HV device and at least one LV device, wherein a gate oxide thickness of the HV device is greater than a gate oxide thickness of the LV device, and the compound MOS capacitor is categorized as the HV device.

5. A phase-locked loop, comprising:
 a phase frequency detector, measuring phase difference and frequency difference between a reference signal and a feedback signal;
 a charge pump, comprising a charge circuit and a discharge circuit, and switching between the charge circuit and the discharge circuit according to the phase difference and the frequency difference of the reference signal and the feedback signal;
 a loop filter, comprising at least one compound MOS capacitor charged/discharged by the charge pump to adjust the voltage level of an output terminal of the loop filter; and
 a voltage control oscillator, outputting an oscillating signal, and adjusting the frequency of the oscillating signal according to the voltage level of the output terminal of the loop filter;
 wherein the compound MOS capacitor comprises:
  a HV PMOS capacitor with a HV PMOS threshold voltage, having a base coupled to a source terminal of a low bias voltage source; and
  a HV NMOS capacitor with a HV NMOS threshold voltage, having a base coupled to a ground terminal of the low bias voltage source;
  wherein a gate of the HV PMOS capacitor is connected with a gate of the HV NMOS capacitor and work as a control terminal of the compound MOS capacitor,
  wherein a voltage difference between a voltage value of the source terminal of the low bias voltage source and an absolute value of the HV PMOS threshold voltage approximates to the HV NMOS threshold voltage.

6. The phase-locked loop as claimed in claim 5, wherein the phase-locked loop have devices categorized as HV devices or LV devices, wherein a gate oxide thickness of the HV device is greater than a gate oxide thickness of the LV device, and the loop filter is categorized as the HV device and the voltage control oscillator is categorized as the LV device.

7. The phase-locked loop as claimed in claim 6, wherein the low bias voltage source powers the compound MOS capacitor and the voltage control oscillator.

8. The phase-locked loop as claimed in claim 5, wherein the HV PMOS capacitor and the HV NMOS capacitor of the compound MOS capacitor have the same channel length.

9. The phase-locked loop as claimed in claim 5, wherein channel widths of the HV PMOS capacitor and the HV NMOS capacitor follow a P/N ratio.

10. The phase-locked loop as claimed in claim 5, wherein the loop filter further comprises:
   a resistor, having a first terminal coupled to the output terminal of the loop filter;
   a first compound MOS capacitor, having a control terminal coupled to a second terminal of the resistor; and
   a second compound MOS capacitor, having a control terminal coupled to the output terminal of the loop filter.

* * * * *